United States Patent
Bitou et al.

(10) Patent No.: US 11,793,083 B2
(45) Date of Patent: Oct. 17, 2023

(54) VIBRATION SENSOR AND PIEZOELECTRIC ELEMENT

(71) Applicants: DAIKIN INDUSTRIES, LTD., Osaka (JP); OSAKA UNIVERSITY, Osaka (JP)

(72) Inventors: Shinya Bitou, Osaka (JP); Tetsuhiro Kodani, Osaka (JP); Saori Sakami, Osaka (JP); Takashi Kanemura, Osaka (JP); Tsuyoshi Sekitani, Osaka (JP); Takafumi Uemura, Osaka (JP); Shusuke Yoshimoto, Osaka (JP)

(73) Assignees: DAIKIN INDUSTRIES, LTD., Osaka (JP); OSAKA UNIVERSITY, Osaka (JP)

( * ) Notice: Subject to any disclaimer, the term of this patent is extended or adjusted under 35 U.S.C. 154(b) by 558 days.

(21) Appl. No.: 16/628,765

(22) PCT Filed: Jul. 5, 2018

(86) PCT No.: PCT/JP2018/025589
§ 371 (c)(1),
(2) Date: Jan. 6, 2020

(87) PCT Pub. No.: WO2019/009374
PCT Pub. Date: Jan. 10, 2019

(65) Prior Publication Data
US 2020/0144481 A1    May 7, 2020

(30) Foreign Application Priority Data
Jul. 7, 2017   (JP) ................ 2017-133486

(51) Int. Cl.
*H01L 41/193*   (2006.01)
*G01P 15/09*    (2006.01)
(Continued)

(52) U.S. Cl.
CPC ........... *H10N 30/857* (2023.02); *G01H 11/08* (2013.01); *G01P 15/0922* (2013.01); *H10N 30/302* (2023.02)

(58) Field of Classification Search
CPC ....... H01L 41/193; H01L 41/113–1138; H01L 41/1132; H04R 17/005; G01H 11/008;
(Continued)

(56) References Cited

U.S. PATENT DOCUMENTS 3,798,473 A * 3/1974 Murayama ........... H04R 17/005
                                                          310/334
4,368,525 A   1/1983 Obata et al.
(Continued)

FOREIGN PATENT DOCUMENTS

DE   02004 002914 B4 * 12/2004 ............. G01N 27/00
DE   102004002914 B  * 12/2005 ............. G01N 27/00
(Continued)

OTHER PUBLICATIONS

Extended European Search Report dated Jan. 27, 2021 in corresponding European Patent Application No. 18828063.0.
(Continued)

*Primary Examiner* — John A Bodnar
(74) *Attorney, Agent, or Firm* — Wenderoth, Lind & Ponack, L.L.P.

(57) ABSTRACT

An object of the present invention is to provide a vibration sensor in which the frequency dependence of the output is small. The present invention provides a vibration sensor 1 comprising: a support 2; an organic piezoelectric material 3 deformably disposed in or on the support 2; and an electrode 4 for extracting an electrical signal generated by deformation of the organic piezoelectric material 3, the electrode 4 being formed on the organic piezoelectric material 3, the organic piezoelectric material 3 comprising a copolymer of
(Continued)

vinylidene fluoride and one or more monomers copolymerizable with vinylidene fluoride.

15 Claims, 6 Drawing Sheets

(51) Int. Cl.
  *G01H 11/08* (2006.01)
  *H01L 41/113* (2006.01)
  *H10N 30/857* (2023.01)
  *H10N 30/30* (2023.01)
(58) Field of Classification Search
  CPC ..... G01H 11/08; C08L 27/16; C08L 2205/02; C08L 2205/025; C08F 214/22; C08F 214/26
  See application file for complete search history.

(56) References Cited

U.S. PATENT DOCUMENTS

| | | |
|---|---|---|
| 2016/0202823 A1 | 7/2016 | Kodani et al. |
| 2017/0192509 A1* | 7/2017 | Kim ................. H01L 41/22 |
| 2018/0160248 A1* | 6/2018 | Murakami ........... H04R 31/003 |

FOREIGN PATENT DOCUMENTS

| | | |
|---|---|---|
| JP | S51-068277 A | 6/1976 |
| JP | 52-140374 | 10/1977 |
| JP | S56-012513 A | 2/1981 |
| JP | 01-119077 | 5/1989 |
| JP | 03-076598 | 12/1991 |
| JP | H04-14228 A | 5/1992 |
| JP | 6-26807 | 2/1994 |
| JP | 9-133691 | 5/1997 |
| JP | 10-38736 | 2/1998 |
| JP | 2009-224954 | 10/2009 |
| JP | 2010-026938 | 2/2010 |
| JP | 2016-219804 | 12/2016 |
| WO | 2010/061726 | 6/2010 |
| WO | 2017/018313 | 2/2017 |

OTHER PUBLICATIONS

International Search Report dated Sep. 18, 2018 in International (PCT) Application No. PCT/JP2018/025589.

* cited by examiner

VIBRATION SENSOR AND PIEZOELECTRIC ELEMENT

TECHNICAL FIELD

The present invention relates to a vibration sensor using a piezoelectric material and to a piezoelectric element for vibration sensors.

BACKGROUND ART

A method in which a vibration sensor is fixed to an object to be measured and the object is evaluated based on the frequency and the acceleration of vibrations detected by the vibration sensor is available as a method for evaluating an object to be measured, such as a solid structure. A vibration sensor using a piezoelectric material is used as a vibration sensor that can detect the frequency and the acceleration of vibrations (for example, in Patent Literature 1). Such a vibration sensor is called a "piezoelectric vibration sensor" and can detect vibrations based on electrical signals generated by deformation of the piezoelectric material.

CITATION LIST

Patent Literature

PTL 1: JP52-140374U

SUMMARY OF INVENTION

Technical Problem

An object to be measured emits vibrations of various frequencies. Thus, to accurately evaluate an object to be measured using a vibration sensor, the frequency dependence of the output of the vibration sensor is required to be small; i.e., when the acceleration of vibrations is constant, the changes in the output of electrical signals generated by the vibration sensor are required to be small even if the frequency changes.

An object of the present invention is to provide a vibration sensor in which the frequency dependence of the output is small.

Solution to Problem

The present inventors conducted extensive research and found that the above object can be achieved by using an organic piezoelectric material as a piezoelectric material for vibration sensors. The present invention has thus been accomplished.

The present invention includes the following embodiments.

Item 1.
A vibration sensor comprising:
a support;
an organic piezoelectric material deformably disposed in or on the support; and
an electrode for extracting an electrical signal generated by deformation of the organic piezoelectric material, the electrode being formed on the organic piezoelectric material,
the organic piezoelectric material comprising a copolymer of vinylidene fluoride and one or more monomers copolymerizable with vinylidene fluoride.

Item 2.
The vibration sensor according to Item 1, wherein the organic piezoelectric material is a vinylidene fluoride/tetrafluoroethylene-based copolymer piezoelectric material.

Item 3.
The vibration sensor according to Item 2, wherein the molar ratio of repeating units derived from vinylidene fluoride to repeating units derived from tetrafluoroethylene in the vinylidene fluoride/tetrafluoroethylene-based copolymer piezoelectric material is in the range of 30/70 to 95/5.

Item 4.
A piezoelectric element for a vibration sensor, comprising a piezoelectric material that comprises a copolymer of vinylidene fluoride and one or more monomers copolymerizable with vinylidene fluoride.

Item 5.
The piezoelectric element according to Item 4, wherein the piezoelectric material is a vinylidene fluoride/tetrafluoroethylene-based copolymer piezoelectric material.

Item 6.
The piezoelectric element according to Item 5, wherein the molar ratio of repeating units derived from vinylidene fluoride to repeating units derived from tetrafluoroethylene in the vinylidene fluoride/tetrafluoroethylene-based copolymer piezoelectric material is in the range of 30/70 to 95/5.

Item 7.
The piezoelectric element according to any one of Items 4 to 6 for a vibration sensor in which the measurement frequency range is 1 Hz to 1 MHz.

Item 8.
The piezoelectric element according to Item 7, wherein the frequency range is 1 Hz to 10 kHz.

Item 9.
The piezoelectric element according to Item 8, wherein the frequency range is 10 Hz to 2 kHz.

Advantageous Effects of Invention

The present invention provides a vibration sensor in which the frequency dependence of the output is small.

DESCRIPTION OF EMBODIMENTS

Terms

The symbols and the abbreviations in this specification are to be interpreted as having the general meanings in the related technical field to which the present invention pertains, according to the context of this specification, unless otherwise specified.

In this specification, the term "comprise" or "contain" is intended to encompass the meanings of "consist essentially of" and "consist of."

Vibration Sensor

The vibration sensor of the present invention comprises a support;

an organic piezoelectric material deformably disposed in or on the support; and an electrode for extracting an electrical signal generated by deformation of the organic piezoelectric material, the electrode being formed on the piezoelectric material, the organic piezoelectric material comprising a copolymer of vinylidene fluoride and one or more monomers copolymerizable with vinylidene fluoride.

One embodiment of the vibration sensor of the present invention is described below.

Figure 1A:
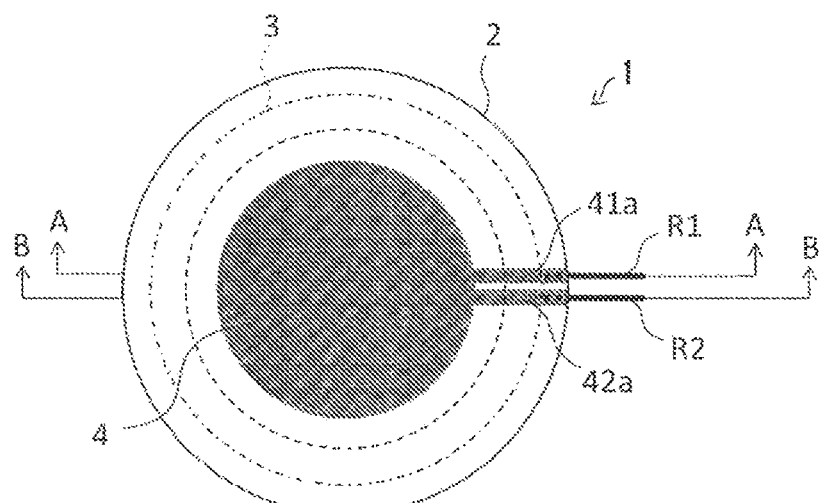
FIG. 1(a) is a plan view of a vibration sensor according to one embodiment of the present invention.
Figure 1B:
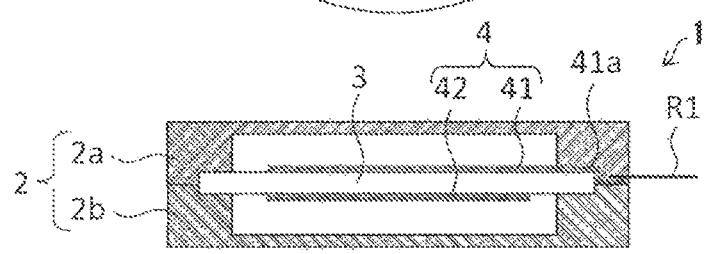
FIG. 1(b) is an A-A cross-sectional view of the vibration sensor.
Figure 1C:
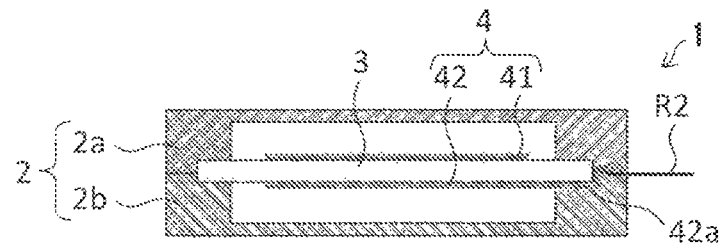
FIG. 1(c) is a B-B cross-sectional view of the vibration sensor.

FIG. 1(a) is a plan view of a vibration sensor 1 according to one embodiment of the present invention. FIG. 1(b) is an A-A cross-sectional view of the vibration sensor 1. FIG. 1(c) is a B-B cross-sectional view of the vibration sensor 1.

As illustrated in FIG. 1, the vibration sensor 1 mainly comprises a support 2, an organic piezoelectric material 3 deformably disposed in or on the support 2, and an electrode 4 for extracting an electrical signal generated by deformation of the organic piezoelectric material 3, the electrode 4 being formed on the organic piezoelectric material 3.

The support 2 includes an upper member 2a and a lower member 2b. In this embodiment, the support 2 includes the members 2a and 2b; however, the support 2 may consist of the lower member 2b only. The material of the support 2 is not limited as long as it has such a degree of rigidity that prevents it from being deformed by vibration. The support 2 may be provided in such a manner that the lower member 2b is grounded using a metallic material.

The organic piezoelectric material 3 is disposed in or on the support 2. The phrase "disposed in or on the support 2" can mean that the organic piezoelectric material 3 is held by the support 2 in direct contact with the support 2 or not in direct contact with the support 2 (e.g., via an adhesive layer). In this embodiment, the organic piezoelectric material 3 is formed into a film shape and is fixed so as to cover all the recesses of the upper member 2a and the lower member 2b. Thus, when vibration is applied to the vibration sensor 1, the organic piezoelectric material 3 is deformed and generates an electrical signal. In FIG. 1(a), the recesses covered with the organic piezoelectric material 3 are shown with a dashed line.

The organic piezoelectric material 3 need not be in the form of a film and may have any shape that can be deformed by application of vibration to the vibration sensor 1. The manner in which the organic piezoelectric material 3 is attached to the support 2 is also not limited. For example, the organic piezoelectric material 3 may be fixed to the support 2 with an adhesive.

The thickness of the organic piezoelectric material 3 is generally in the range of 0.5 µm to 2 mm, preferably in the range of 3 to 500 µm, more preferably in the range of 6 to 50 µm, and even more preferably in the range of 10 to 40 µm.

The organic piezoelectric material 3 may be a single layer or a laminate in which multiple film-shaped piezoelectric materials are laminated. In this case, the number of layers of the laminate is not limited.

The compositions of the film-shaped piezoelectric materials forming the layers may be the same or different from each other. The thicknesses of the film-shaped piezoelectric materials forming the layers also may be the same or different from each other.

Moreover, the polarization directions of the film-shaped piezoelectric materials forming the layers may be the same or different from each other.

Further, the laminate may be in the form of a sheet or a roll.

The film-shaped piezoelectric materials forming the layers may be adhered together using an adhesive sheet or an adhesive means, such as an adhesive, or may be thermocompression-bonded.

The composition of the organic piezoelectric material 3 is described later.

The electrode 4 may be formed from a conductive metal film. In this embodiment, the electrode 4 includes an upper electrode 41 formed on the front surface of the organic piezoelectric material 3 and a lower electrode 42 formed on the back surface of the organic piezoelectric material 3.

The upper electrode 41 includes a circular portion formed on a deformable portion of the organic piezoelectric material 3, and a lead-out portion 41a extending out from the circular portion. As illustrated in FIGS. 1(a) and 1(b), the lead-out portion 41a extends rightward on the front surface of the organic piezoelectric material 3 in the drawings. The end of the lead-out portion 41a is connected to an end of a lead wire R1.

Likewise, the lower electrode 42 includes a circular portion formed on a deformable portion of the organic piezoelectric material 3, and a lead-out portion 42a extending out from the circular portion. As illustrated in FIGS. 1(a) and 1(c), the lead-out portion 42a extends rightward between the back surface of the organic piezoelectric material 3 and the support 2 in the drawings. The end of the lead-out portion 42a is connected to an end of a lead wire R2.

The other end of the lead wire R1 and the other end of the lead wire R2 may be connected to a cable for connecting the vibration sensor 1 to an external device with a connector, such as a coaxial connector.

When the organic piezoelectric material 3 is deformed to generate an electromotive force, a potential difference is generated between the upper electrode 41 and the lower electrode 42. An electrical signal of voltage corresponding to the potential difference can thereby be extracted through the lead-out portions 41a and 42a and the lead wires R1 and R2.

The configuration of the electrode 4 is not limited as long as it is capable of extracting an electrical signal generated by the organic piezoelectric material 3. In this embodiment, the electrodes 41 and 42 are formed on both surfaces of the organic piezoelectric material 3; however, an electrode may be formed on only one surface of the organic piezoelectric material 3. For example, when an electrode is formed on only the front surface of the organic piezoelectric material 3, it is preferable to fix the potential of the back surface of the organic piezoelectric material 3.

In the organic piezoelectric material 3, a weight such as that described in Patent Literature 1 is not provided.

The vibration sensor 1 is a both-end-supported beam vibration sensor in which the deformable portions of the organic piezoelectric material 3 are attached with some tension to the recesses of the upper member 2a and the lower member 2b. However, the present invention can be applied to vibration sensors of any structure, such as cantilever-beam vibration sensors and ring vibration sensors. For example, the organic piezoelectric material 3 according to this embodiment may be used as a piezoelectric material for detecting vibration in the cantilever-beam vibration sensors disclosed in, for example, JPH06-026807A and JPH09-133691A.

Piezoelectric Element

The organic piezoelectric material of the vibration sensor according to the present invention can function as a piezoelectric element.

As is understood from the above, the present invention also provides a piezoelectric element for vibration sensors that comprises a piezoelectric material comprising a copolymer of vinylidene fluoride and one or more monomers copolymerizable with vinylidene fluoride.

The form and the thickness of the piezoelectric element may be the same as those that are understood from the descriptions regarding the organic piezoelectric material in the vibration sensor.

In the present specification, the organic piezoelectric material suitably comprises a polymer (or consists essentially of a polymer).

The organic piezoelectric material may be suitably a resin film or the like.

The organic piezoelectric material may comprise additives generally used in resin films.

In the present specification, the meaning of the phrase "the organic piezoelectric material comprises a polymer" includes a case in which the organic piezoelectric material comprises the polymer in an amount in which the solid structure (e.g., the structure of a free-standing film) can be maintained by only the polymer.

Preferable examples of the organic piezoelectric material include an organic piezoelectric material comprising a copolymer of vinylidene fluoride and one or more monomers copolymerizable with vinylidene fluoride.

In the present specification, the organic piezoelectric material may have piezoelectricity as a result of being subjected to a piezoelectric treatment (e.g., a corona treatment or a stretching treatment), as a person skilled in the art would understand.

Examples of the "monomers copolymerizable with vinylidene fluoride" in the "copolymer of vinylidene fluoride and one or more monomers copolymerizable with vinylidene fluoride" include trifluoroethylene, tetrafluoroethylene, hexafluoropropylene, chlorotrifluoroethylene, vinyl fluoride, and like fluorine-containing monomers.

The "one or more monomers copolymerizable with vinylidene fluoride," or at least one of them, is preferably tetrafluoroethylene.

Specific examples of the "piezoelectric material comprising a copolymer of vinylidene fluoride and one or more monomers copolymerizable with vinylidene fluoride" include a vinylidene fluoride/trifluoroethylene-based copolymer piezoelectric material and a vinylidene fluoride/tetrafluoroethylene-based copolymer piezoelectric material.

Among these, preferable examples include a vinylidene fluoride/tetrafluoroethylene-based copolymer piezoelectric material.

The "vinylidene fluoride/tetrafluoroethylene-based copolymer piezoelectric material" may contain repeating units derived from a monomer other than vinylidene fluoride and tetrafluoroethylene as long as the properties regarding the present invention are not significantly impaired.

The "vinylidene fluoride/tetrafluoroethylene-based copolymer" of the "vinylidene fluoride/tetrafluoroethylene-based copolymer piezoelectric material" includes a vinylidene fluoride/tetrafluoroethylene copolymer.

Likewise, the "vinylidene fluoride/trifluoroethylene-based copolymer piezoelectric material" may contain repeating units derived from a monomer other than vinylidene fluoride and trifluoroethylene as long as the properties regarding the present invention are not significantly impaired.

The "vinylidene fluoride/trifluoroethylene-based copolymer" of the "vinylidene fluoride/trifluoroethylene-based copolymer piezoelectric material" includes a vinylidene fluoride/trifluoroethylene copolymer.

The "(1) copolymer of vinylidene fluoride and one or more monomers copolymerizable with vinylidene fluoride" preferably contains 30 mol % or more (preferably 60 mol % or more, and more preferably 70 mol % or more) of repeating units derived from vinylidene fluoride.

In the present invention, the molar ratio of the repeating units derived from vinylidene fluoride to the repeating units derived from tetrafluoroethylene in the "vinylidene fluoride/tetrafluoroethylene-based copolymer" (and the "vinylidene fluoride/tetrafluoroethylene copolymer") is, from the viewpoint of high piezoelectricity, preferably in the range of 30/70 to 95/5, more preferably in the range of 40/60 to 95/5, even more preferably in the range of 50/50 to 95/5, still even more preferably in the range of 60/40 to 95/5, particularly preferably in the range of 70/30 to 90/10, and more particularly preferably in the range of 70/30 to 85/15.

In the present invention, the molar ratio of the repeating units derived from vinylidene fluoride to the repeating units derived from tetrafluoroethylene in the "vinylidene fluoride/tetrafluoroethylene-based copolymer" (and the "vinylidene fluoride/tetrafluoroethylene copolymer") is, from the viewpoint of high heat resistance, preferably in the range of 30/70 to 95/5, more preferably in the range of 30/70 to 90/10, even more preferably in the range of 30/70 to 85/15, and still even more preferably in the range of 40/60 to 70/30.

Suitably setting the molar ratio based on the ranges described above achieves both high piezoelectricity and high heat resistance.

As described above, the "vinylidene fluoride/tetrafluoroethylene-based copolymer" may contain repeating units derived from a monomer other than vinylidene fluoride and tetrafluoroethylene as long as the properties regarding the present invention are not significantly impaired. The content of such repeating units is generally 10 mol % or less. Such monomers are not limited as long as they can be copolymerized with a vinylidene fluoride monomer and a tetrafluoroethylene monomer. Examples include:

(1) fluoromonomers (e.g., vinyl fluoride (VF), trifluoroethylene (TrFE), hexafluoropropene (HFP), 1-chloro-1-fluoro-ethylene (1,1-CFE), 1-chloro-2-fluoro-ethylene (1,2-CFE), 1-chloro-2,2-difluoroethylene (CDFE), chlorotrifluoroethylene (CTFE), trifluorovinyl monomers, 1,1,2-trifluorobutene-4-bromo-1-butene, 1,1,2-trifluorobutene-4-silane-1-butene, perfluoroalkyl vinyl ether, perfluoromethyl vinyl ether (PMVE), perfluoropropyl vinyl ether (PPVE), perfluoroacrylate, 2,2,2-trifluoroethyl acrylate, 2-(perfluorohexyl) ethyl acrylate), and 3,3,4,4,5,5,6,6,7,7,8,8,8-tridecafluorooct-1-ene ($C_6$ olefin); and (2) hydrocarbon-based monomers (e.g., ethylene, propylene, maleic anhydride, vinyl ether, vinyl ester, allyl glycidyl ether, acrylic acid-based monomers, methacrylic acid-based monomers, and vinyl acetate).

In the present invention, the inner haze value of the vinylidene fluoride/tetrafluoroethylene-based copolymer organic piezoelectric material as measured by the following method is, from the viewpoint of output, 0.5% or more, preferably 3% or more, more preferably 15% or more, even more preferably 40% or more, and still even more preferably 50% or more.

The total haze value is obtained by a haze (turbidity) test according to ASTM D1003 by using an NDH7000SP haze meter (product name, Nippon Denshoku Industries Co., Ltd.) or an equivalent device. The inner haze value is measured using an NDH7000SP haze meter (product name, Nippon Denshoku Industries Co., Ltd.). Specifically, water is poured into a glass cell, and a reference is measured; thereafter, an organic piezoelectric material is added to the water, and the haze value is measured; and the reference value is subtracted from this. The same applies to the Examples described later.

In the present invention, the piezoelectric constant d33 of the vinylidene fluoride/tetrafluoroethylene-based copolymer organic piezoelectric material is, from the viewpoint of output, in the range of −1 to −40 pC/N, preferably in the range of −3 to −40 pC/N, more preferably in the range of −10 to −40 pC/N, and even more preferably in the range of −15 to −40 pC/N.

The organic piezoelectric material may contain additives in addition to the polymer described above, if necessary, as long as the effects of the present invention are not significantly impaired.

Examples of additives include barium titanate ($BaTiO_3$), lead titanate ($PbTiO_3$), lead zirconate titanate ($Pb(Zr,Ti)O_3$), and further, lead lanthanum zirconate titanate ($(Pb,La)(Zr,Ti)O_3$), which is obtained by adding a small amount of La to $Pb(Zr,Ti)O_3$, and like inorganic ceramic piezoelectric materials.

The organic piezoelectric material is commercially available or can be produced by a known production method.

The electrical signal generated by the vibration sensor is preferably an electrical signal at a frequency of 1 Hz to 1 MHz, more preferably 1 Hz to 10 kHz, even more preferably 1 Hz to 5 kHz, and still even more preferably 10 Hz to 2 kHz.

As shown in the Examples described later, in the vibration sensor 1 using a vinylidene fluoride/tetrafluoroethylene copolymer as the organic piezoelectric material 3 (vibration sensors C to F described later in the Examples), the frequency dependence of the output is small in the frequency range of 10 Hz to 2 kHz. In the vibration sensor 1 using a polyvinylidene fluoride piezoelectric material as the organic piezoelectric material 3 (vibration sensor A described later in the Examples), output linearity with respect to changes in the level of vibration applied is good in the frequency range of 10 Hz to 2 kHz. Thus, an object to be evaluated that emits a frequency of particularly 10 Hz to 2 kHz can be evaluated accurately.

Moreover, compared with polyvinylidene fluoride, the vinylidene fluoride/tetrafluoroethylene copolymer has the following advantages:
the frequency dependence of the output in the piezoelectric material is small;
the vinylidene fluoride/tetrafluoroethylene copolymer is easy to dissolve in a solvent and easy to apply;
the film thickness of the piezoelectric material is easily controlled;
there is no anisotropy in in-plane piezoelectricity;
since the crystallinity and the film thickness can be controlled according to conditions when applied, the piezoelectricity is easily controlled;
the vinylidene fluoride/tetrafluoroethylene copolymer has piezoelectricity without stretching;
the heat resistance is good;
the corrosion resistance is good; and
since the environment resistance is good, temporal changes in piezoelectricity are small.

Further, as shown in the Examples described later, the output is higher in a vibration sensor using an organic piezoelectric material with a large inner haze value than in a vibration sensor using an organic piezoelectric material with a small inner haze value. Thus, it is preferable that the inner haze value of the organic piezoelectric material 3 is large.

The embodiment of the present invention has been described above; however, the present invention is not limited to the embodiment. Various modifications may be used without departing from the scope of the invention.

Examples

Examples are given below to illustrate the present invention in more detail; however, the present invention is not limited to these Examples.

Preparation of Vibration Sensor

In the Examples, vibration sensors having substantially the same configuration as that of the vibration sensor shown in FIG. 1 were used. The vibration sensors were prepared in the following manner.

1. A film-shaped organic piezoelectric material 3 with protective films attached to both its surfaces was prepared and cut to a predetermined size. Specifically, samples A to F shown in Table 1 were prepared as the organic piezoelectric material 3.

TABLE 1

| Organic piezoelectric material | Material | Film thickness (μm) | d33 (pC/N) | Inner haze value (%) |
|---|---|---|---|---|
| Sample A | Polyvinylidene fluoride | 28 | −23.7 | 2.8 |
| Sample B | Vinylidene flouride/trifluoroethylene copolymer | 30 | −22.4 | 11.0 |
| Sample C | Vinylidene flouride/trifluoroethylene copolymer | 30 | −10.6 | 0.5 |
| Sample D | Vinylidene flouride/trifluoroethylene copolymer | 30 | −19.5 | 47.6 |
| Sample E | Vinylidene flouride/trifluoroethylene copolymer | 20 | −10.3 | 0.4 |
| Sample F | Vinylidene flouride/trifluoroethylene copolymer | 40 | −14.0 | 0.8 |

Samples C to F all had a molar ratio of the repeating units derived from vinylidene fluoride to the repeating units derived from tetrafluoroethylene of 80/20.

2. The protective films are peeled off from the organic piezoelectric material 3, and an aluminum film pattern in the shape of a square with a side length of 25 mm was vapor-deposited on both surfaces of the organic piezoelectric material 3, with a thickness of about 100 nm, as an upper electrode 41 and a lower electrode 42.

3. A 3-mm-thick support 2 (an upper member 2a and a lower member 2b) formed from an acrylic plate was prepared. The size and the shape of the recesses of the upper member 2a and the lower member 2b covered with the organic piezoelectric material 3 were a circular shape with a diameter of 30 mm.

4. Coaxial connectors were prepared, and two lead wires R1 and R2 were soldered to the connectors.

According to the above procedure, six vibration sensors respectively comprising the samples A to F as the organic piezoelectric material 3 (which hereinafter may be referred to as "vibration sensors A to F") were prepared.

Applying Vibration to Vibration Sensor

To examine the frequency dependence and the output linearity of each vibration sensor 1 prepared in the manner described above, vibration was applied to the vibration sensor 1 using a vibrator (type: i240; produced by IMV Corporation). Specifically, the vibration sensor 1 was fixed to an aluminum plate in the shape of a square with a side length of 140 mm with an epoxy-based adhesive, and the aluminum plate was fixed to the vibrator with a bolt. Further, the vibration sensor was connected to an oscilloscope by using coaxial cables.

Frequency Response Test

In a frequency response test to examine the frequency dependence of the output, the acceleration of vibration (level of vibration applied) was set to 1.0 m/s$^2$, and the vibrator was driven while changing the frequency at six levels (10 Hz, 50 Hz, 100 Hz, 500 Hz, 1000 Hz, and 2000 Hz) to measure the output (μV) of the vibration sensor 1. This measurement was carried out for each of the six vibration sensors A to F.

Figure 2:
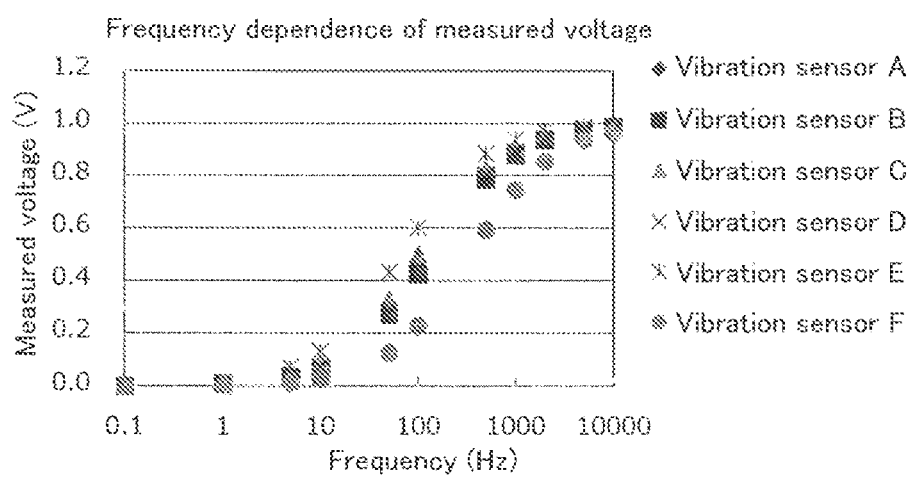
FIG. 2 is a graph showing the frequency dependence of the measured voltage of each of the piezoelectric materials used in the Examples of the present invention.
Figure 3A:
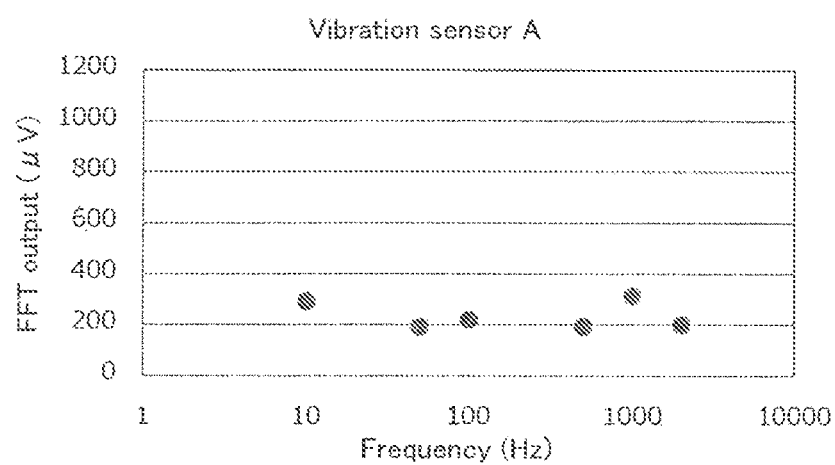
FIG. 3(a), FIG. 3(b), and FIG. 3(c) are graphs showing measurement results 1 of a frequency response test in the Examples of the present invention.
Figure 3B:
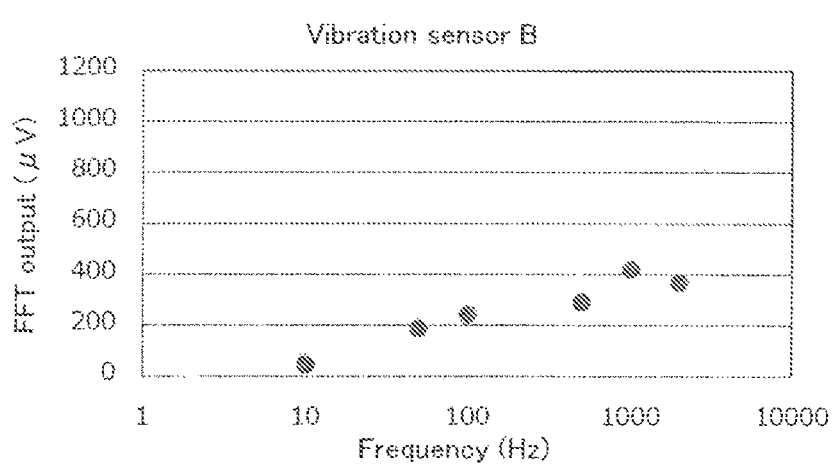
Figure 3C:
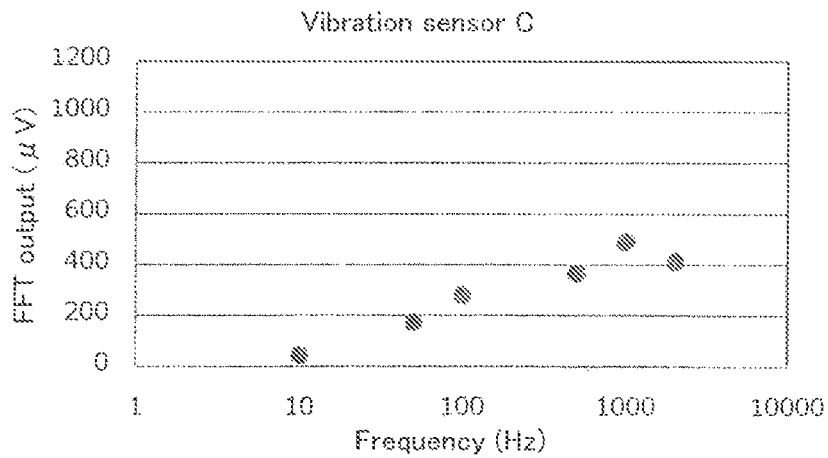
Figure 4A:
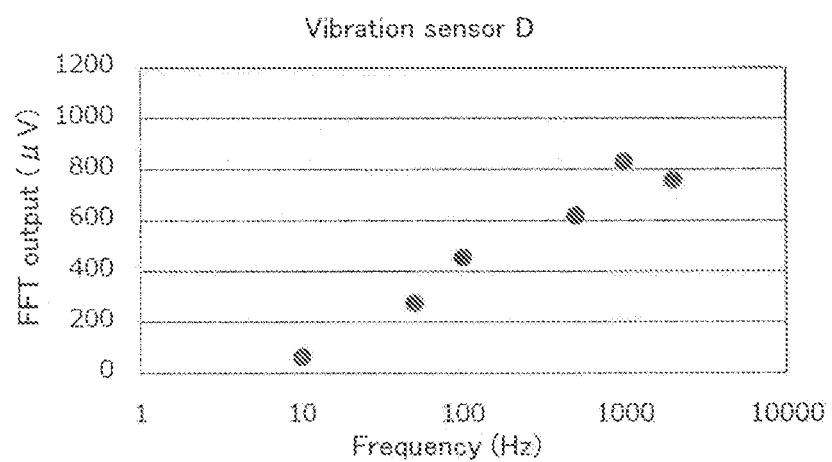
FIG. 4(a), FIG. 4(b), and FIG. 4(c) are graphs showing measurement results 1 of a frequency response test in the Examples of the present invention.
Figure 4B:
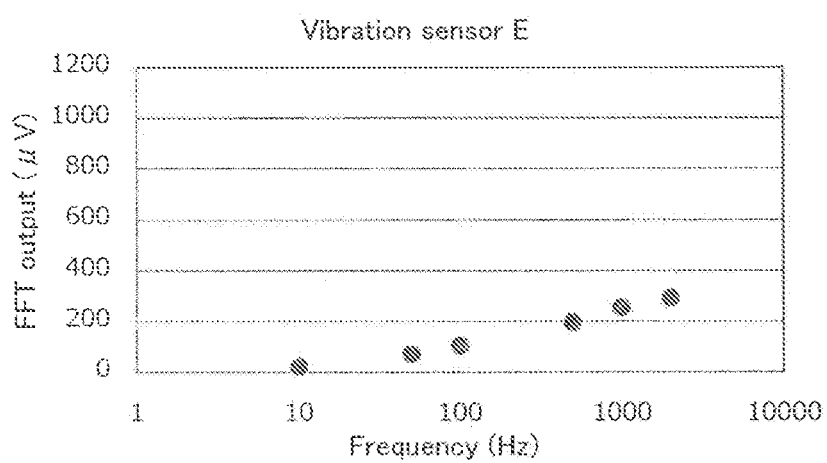
Figure 4C:
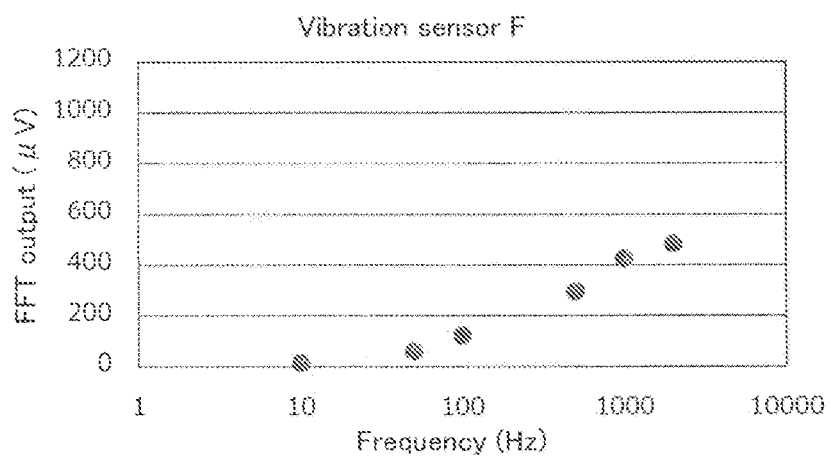
Figure 5A:
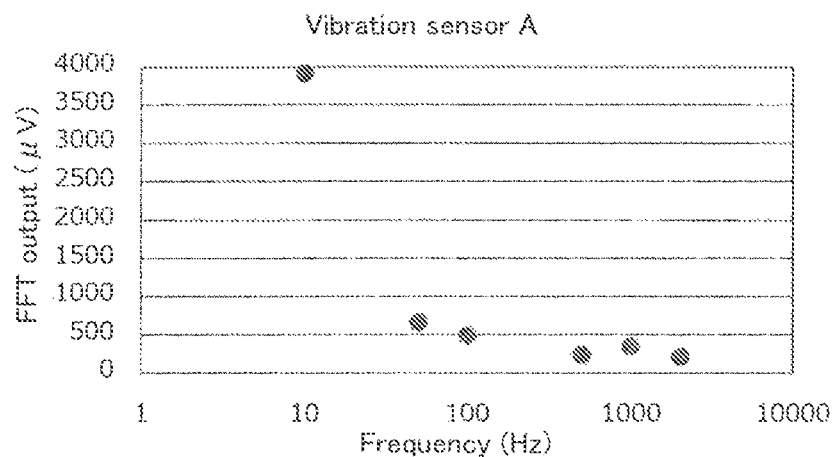
FIG. 5(a), FIG. 5(b), and FIG. 5(c) are graphs showing measurement results 2 of a frequency response test in the Examples of the present invention.
Figure 5B:
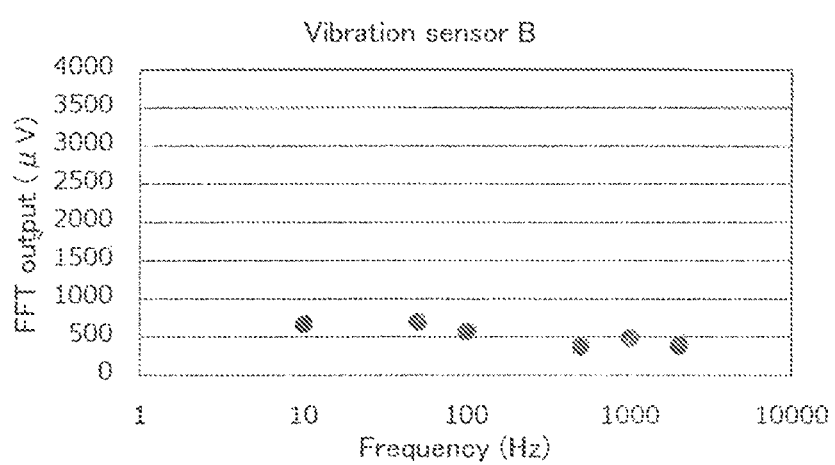
Figure 5C:
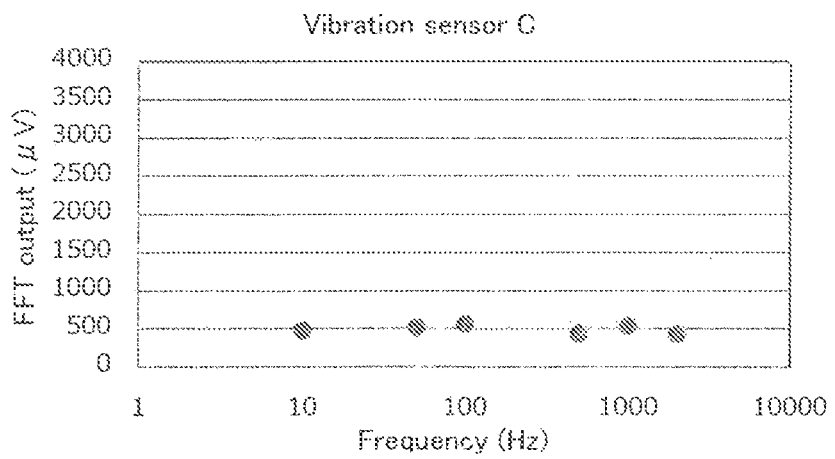
Figure 6A:
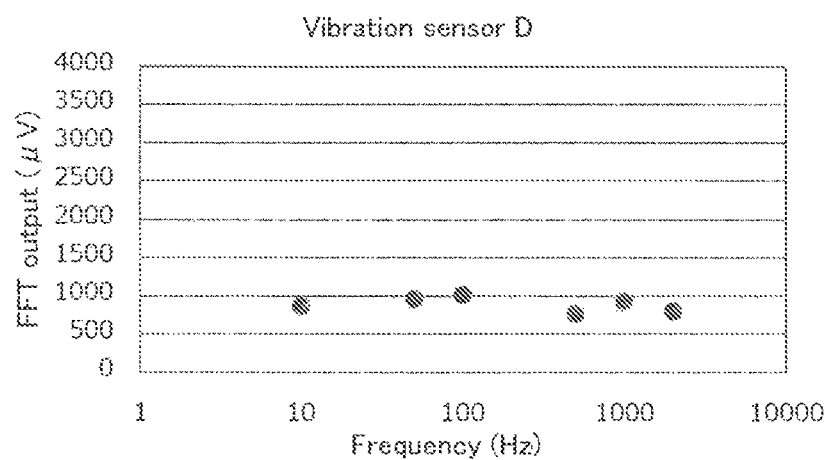
FIG. 6(a), FIG. 6(b), and FIG. 6(c) are graphs showing measurement results 2 of a frequency response test in the Examples of the present invention.
Figure 6B:
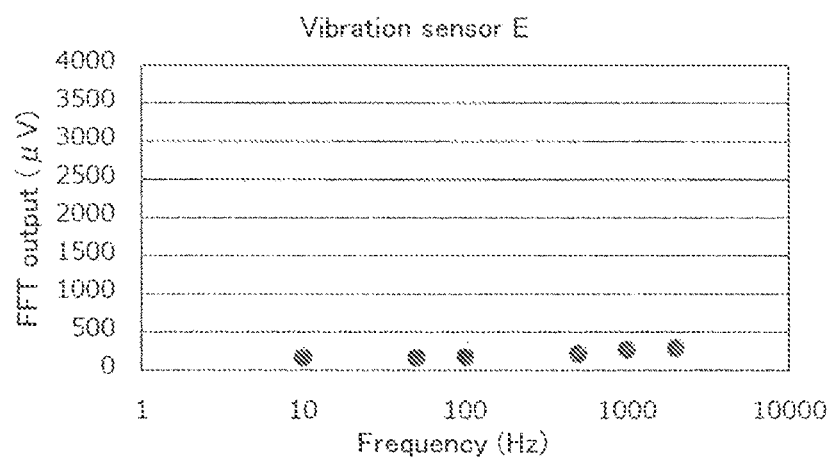
Figure 6C:
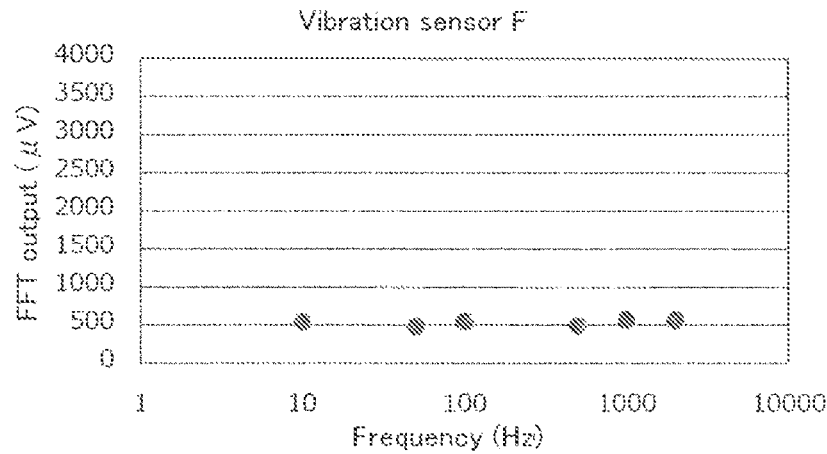

The voltage of an electrical signal actually measured is frequency-dependent due to the influence of the cut-off. Specifically, as the frequency decreases, the measured voltage tends to decrease; and as the frequency increases, the measured voltage tends to increase. This tendency varies depending on the resistance of the electrode and the cables, the resistance of the oscilloscope, and the characteristics of the amplifier in the oscilloscope. Thus, the frequency dependence of the vibration sensors A to F was measured beforehand. FIG. 2 and Table 2 show the results of measurement of the frequency dependence of the measured voltage in each of the vibration sensors A to F, assuming that the voltage generated from the organic piezoelectric material was 1 V.

Results

Table 3 and the graphs in FIGS. 3(a) to 3(c) and 4(a) to 4(c) show the measurement result 1 in the frequency response test.

TABLE 3

| Vibration sensor | Frequency (Hz) | | | | | |
|---|---|---|---|---|---|---|
| | 10 | 50 | 100 | 500 | 1000 | 2000 |
| Vibration sensor A | 293.4 | 193.0 | 220.7 | 193.9 | 314.4 | 200.2 |
| Vibration sensor B | 46.5 | 189.0 | 243.3 | 293.4 | 422.7 | 370.0 |
| Vibration sensor C | 43.9 | 174.8 | 282.6 | 370.0 | 492.6 | 414.5 |
| Vibration sensor D | 65.5 | 277.7 | 457.4 | 622.3 | 832.2 | 760.3 |
| Vibration sensor E | 23.7 | 74.6 | 106.3 | 198.5 | 256.7 | 293.4 |
| Vibration sensor F | 15.6 | 62.7 | 125.4 | 299.2 | 426.6 | 485.8 |

Table 4 and the graphs in FIGS. 5(a) to 5(c) and 6(a) to 6(c) show the measurement result 2 in the frequency response test.

TABLE 4

| Vibration sensor | Frequency (Hz) | | | | | |
|---|---|---|---|---|---|---|
| | 10 | 50 | 100 | 500 | 1000 | 2000 |
| Vibration sensor A | 3915.4 | 669.4 | 493.1 | 241.7 | 353.2 | 212.6 |
| Vibration sensor B | 674.1 | 699.2 | 571.7 | 372.6 | 479.7 | 394.9 |
| Vibration sensor C | 483.6 | 524.9 | 565.7 | 444.1 | 541.9 | 435.2 |
| Vibration sensor D | 874.5 | 963.1 | 1022.0 | 775.9 | 934.9 | 807.3 |
| Vibration sensor E | 179.1 | 172.3 | 176.0 | 224.6 | 273.6 | 303.0 |
| Vibration sensor F | 543.3 | 487.8 | 550.1 | 502.0 | 571.1 | 568.1 |

Table 5 shows the average output (μV) and the output width (difference between the maximum output and the minimum output) of the measurement result 2.

TABLE 2

| Vibration sensor | Frequency (Hz) | | | | | | | | | | |
|---|---|---|---|---|---|---|---|---|---|---|---|
| | 0.1 | 1 | 5 | 10 | 50 | 100 | 500 | 1000 | 2000 | 5000 | 10000 |
| Vibration sensor A | 0.0008 | 0.0080 | 0.0389 | 0.0749 | 0.2883 | 0.4476 | 0.8020 | 0.8901 | 0.9419 | 0.9759 | 0.9878 |
| Vibration sensor B | 0.0007 | 0.0074 | 0.0357 | 0.0690 | 0.2703 | 0.4256 | 0.7875 | 0.8811 | 0.9368 | 0.9737 | 0.9867 |
| Vibration sensor C | 0.0010 | 0.0099 | 0.0476 | 0.0908 | 0.3330 | 0.4996 | 0.8331 | 0.9090 | 0.9523 | 0.9804 | 0.9901 |
| Vibration sensor D | 0.0008 | 0.0080 | 0.0389 | 0.0749 | 0.2883 | 0.4476 | 0.8020 | 0.8901 | 0.9419 | 0.9759 | 0.9878 |
| Vibraton sensor E | 0.0015 | 0.0150 | 0.0709 | 0.1324 | 0.4328 | 0.6041 | 0.8841 | 0.9385 | 0.9683 | 0.9871 | 0.9935 |
| Vibration sensor F | 0.0003 | 0.0029 | 0.0145 | 0.0287 | 0.1286 | 0.2279 | 0.5961 | 0.7469 | 0.8551 | 0.9365 | 0.9672 |

In the frequency response test, the measurement values of electrical signals generated by the vibration sensors A to F were corrected based on the frequency dependence shown in FIG. 2. In the Examples, the actual, measurement value of an electrical signal was regarded as "measurement result 1," and a value obtained by correcting the measurement result 1 based on the frequency dependence was regarded as "measurement result 2."

TABLE 5

| Vibration sensor | Average output (μV) | Output width (μV) |
|---|---|---|
| Vibration sensor A | 980.9 | 3702.9 |
| Vibration sensor B | 532.0 | 326.5 |
| Vibration sensor C | 499.2 | 130.4 |

TABLE 5-continued

| Vibration sensor | Average output (μV) | Output width (μV) |
|---|---|---|
| Vibration sensor D | 896.3 | 246.1 |
| Vibration sensor E | 221.4 | 130.8 |
| Vibration sensor F | 537.1 | 83.3 |

The measurement result 2 shows that the change in the output was small, and the frequency dependence was small, in the frequency range of 100 to 2000 Hz in each of the vibration sensors A to F. From this result, it was confirmed that good frequency dependence can be obtained in a range from a low frequency to a high frequency by using polyvinylidene fluoride, a vinylidene fluoride/trifluoroethylene copolymer, or a vinylidene fluoride/tetrafluoroethylene copolymer as an organic piezoelectric material.

Further, in the vibration sensors C to F, the output at a very low frequency of 10 Hz was almost the same as that in the frequency range of 50 to 2000 Hz. Thus, it was confirmed that good frequency dependence can be obtained in a range from a very low frequency to a high frequency by using a vinylidene fluoride/tetrafluoroethylene copolymer.

In addition, the output at 100 to 2000 Hz was larger in the vibration sensors B to D and F than in the vibration sensor A. Specifically, it was confirmed that larger output can be obtained in a high frequency range when a vinylidene fluoride/tetrafluoroethylene copolymer or a vinylidene fluoride/trifluoroethylene copolymer is used as an organic piezoelectric material.

Further, the output of the vibration sensor D was larger than that of the vibration sensor C at all of the frequencies. This is because as the inner haze value of the organic piezoelectric material increases, the absolute value of the piezoelectric constant d33 increases.

DESCRIPTION OF THE REFERENCE NUMERALS

1: Vibration sensor
2: Support
2a: Upper member
2b: Lower member
3: Organic piezoelectric material
4: Electrode
41: Upper electrode
41a: Lead-out portion
42: Lower electrode
42a: Lead-out portion

The invention claimed is:

1. A vibration sensor comprising:
a support;
an organic piezoelectric material deformably disposed in or on the support; and
an electrode for extracting an electrical signal generated by deformation of the organic piezoelectric material, the electrode being formed on the organic piezoelectric material,
the organic piezoelectric material comprising a copolymer of vinylidene fluoride and one or more monomers copolymerizable with vinylidene fluoride, comprising no inorganic ceramic piezoelectric materials, and having an inner haze value of 3% or more,
wherein the vibration sensor is fixed to an object to be measured in order to detect the vibration of the object, and wherein the object has a solid structure.

2. The vibration sensor according to claim 1, wherein the organic piezoelectric material is a vinylidene fluoride/tetrafluoroethylene-based copolymer piezoelectric material.

3. The vibration sensor according to claim 2, wherein the molar ratio of repeating units derived from vinylidene fluoride to repeating units derived from tetrafluoroethylene in the vinylidene fluoride/tetrafluoroethylene-based copolymer piezoelectric material is in the range of 30/70 to 95/5.

4. A piezoelectric element for a vibration sensor, comprising a piezoelectric material that comprises a copolymer of vinylidene fluoride and one or more monomers copolymerizable with vinylidene fluoride, that comprises no inorganic ceramic piezoelectric materials, and that has an inner haze value of 3% or more, wherein the vibration sensor is fixed to an object to be measured in order to detect the vibration of the object, and wherein the object has a solid structure.

5. The piezoelectric element according to claim 4, wherein the piezoelectric material is a vinylidene fluoride/tetrafluoroethylene-based copolymer piezoelectric material.

6. The piezoelectric element according to claim 5, wherein the molar ratio of repeating units derived from vinylidene fluoride to repeating units derived from tetrafluoroethylene in the vinylidene fluoride/tetrafluoroethylene-based copolymer piezoelectric material is in the range of 30/70 to 95/5.

7. The piezoelectric element according to claim 4 for a vibration sensor in which the measurement frequency range is 1 Hz to 1 MHz.

8. The piezoelectric element according to claim 7, wherein the frequency range is 1 Hz to 10 kHz.

9. The piezoelectric element according to claim 8, wherein the frequency range is 10 Hz to 2 kHz.

10. The piezoelectric element according to claim 5 for a vibration sensor in which the measurement frequency range is 1 Hz to 1 MHz.

11. The piezoelectric element according to claim 10, wherein the frequency range is 1 Hz to 10 kHz.

12. The piezoelectric element according to claim 11, wherein the frequency range is 10 Hz to 2 kHz.

13. The piezoelectric element according to claim 6 for a vibration sensor in which the measurement frequency range is 1 Hz to 1 MHz.

14. The piezoelectric element according to claim 13, wherein the frequency range is 1 Hz to 10 kHz.

15. The piezoelectric element according to claim 14, wherein the frequency range is 10 Hz to 2 kHz.

* * * * *